(12) United States Patent
Ishizuka et al.

(10) Patent No.: US 8,277,581 B2
(45) Date of Patent: Oct. 2, 2012

(54) NICKEL-IRON-ZINC ALLOY NANOPARTICLES

(75) Inventors: Masayuki Ishizuka, Chiyoda-ku (JP); Nobuhiro Hidaka, Chiyoda-ku (JP)

(73) Assignee: Sumitomo Osaka Cement Co., Ltd., Chiyoda-ku, Tokyo (JP)

( * ) Notice: Subject to any disclaimer, the term of this patent is extended or adjusted under 35 U.S.C. 154(b) by 551 days.

(21) Appl. No.: 12/595,562

(22) PCT Filed: Apr. 10, 2008

(86) PCT No.: PCT/JP2008/087101
§ 371 (c)(1),
(2), (4) Date: Oct. 12, 2009

(87) PCT Pub. No.: WO2008/133025
PCT Pub. Date: Nov. 6, 2008

(65) Prior Publication Data
US 2011/0165420 A1   Jul. 7, 2011

(51) Int. Cl.
*C22C 19/03* (2006.01)
*B22F 9/08* (2006.01)
*B22F 9/24* (2006.01)
*B22F 9/04* (2006.01)

(52) U.S. Cl. ........ 148/426; 420/459; 977/763; 977/777; 977/810; 75/374; 75/338

(58) Field of Classification Search ............ 75/228–250, 75/255, 252, 253, 254, 330–341, 343–374, 75/952, 954; 148/300–315, 320–337, 405–419, 148/426–429, 441, 442; 420/8, 94–98, 119, 420/129, 441–460, 513–524; 428/800–848.9, 428/402; 977/762–777; *B22F 1/00; C22C 111/00*
See application file for complete search history.

(56) References Cited

U.S. PATENT DOCUMENTS 7,622,012 B2 * 11/2009 Uozumi et al. ............... 148/312

FOREIGN PATENT DOCUMENTS

| JP | 01-188606 | 7/1989 |
| JP | 2735615 | 1/1998 |
| JP | 63-035701 | 2/1998 |
| JP | 2006-219714 | 8/2006 |

OTHER PUBLICATIONS

JCPDS Card 88-1715.
JCPDS Card 04-0850.

* cited by examiner

*Primary Examiner* — Scott Kastler
*Assistant Examiner* — Vanessa Luk
(74) *Attorney, Agent, or Firm* — Merchant & Gould P.C.

(57) ABSTRACT

Nickel-iron-zinc alloy nanoparticles of the present invention are in the form of tabular particles having a thickness of 1 μm or less and an aspect ratio of 2 or more, wherein the (220) plane which is the crystal plane of the face-centered cubic lattice is oriented on the tabular surface of the particles.

9 Claims, 5 Drawing Sheets

FIG. 10

NICKEL-IRON-ZINC ALLOY NANOPARTICLES

This application is a National Stage Application of PCT/JP2008/057101, filed 10 Apr. 2008, which claims benefit of Serial No. 2007-105734, filed 13 Apr. 2007 in Japan and which application(s) are incorporated herein by reference. To the extent appropriate, a claim of priority is made to each of the above disclosed applications.

TECHNICAL FIELD

The present invention relates to nickel-iron-zinc alloy nanoparticles.

The present application claims priority on Japanese Patent Application No. 2007-105734, filed on Apr. 13, 2007, the content of which is incorporated herein by reference.

BACKGROUND ART

Soft magnetic metals generally refer to metals that have a low coercive force and have the property of demonstrating a large reduction in residual magnetism due to removal of an external magnetic field.

In recent years, soft magnetic metal particles have come to be used in various fields, such as the formation of coated films wherein paints are prepared by dispersing these particles in an organic binder in the form of magnetic pigments and then these paints are coated onto a substrate and the like to form a coated films, or the production of soft magnetic metal/resin composites wherein metal particles are dispersed in a binder in the form of a magnetic filler to form the composites.

An example of a coated film that uses soft magnetic metal particles is a magnetic shielding film. This magnetic shielding film is used to protect electronic circuits and electronic components of electrical devices from external magnetic fields, or prevent leakage of magnetic fields generated by electrical devices to the outside. In addition, this magnetic shielding film is also used for the purpose of preventing forgery or falsification of data contained in magnetic cards such as credit cards. Moreover, coated films using such soft magnetic metals are also used in IC tags (RFID systems) as magnetic sheets, which can improve sensitivity, by applying magnetic field convergence effects attributable to the high magnetic permeability of soft magnetic metals.

On the other hand, soft magnetic metal/resin composites using soft magnetic metals are used in high-frequency electronic circuit substrates since the composites enable the power consumption of electronic circuits to be reduced.

High magnetic permeability alloys such as Al—Si—Fe-based alloy commonly referred to as Sendust alloy (see, for example, Patent Document 1) or Ni—Fe-based alloy commonly referred to as PERMALLOY (trade name) (see, for example, Patent Document 2) are used as such soft magnetic metals.

In addition, soft magnetic metal particles are typically required to have the tabular form having a thickness of 1 μm or less. More specifically, soft magnetic metal particles of various tabular shapes have been proposed, such as flat-shaped, scale-shaped and flake-shaped particles (see, for example, Patent Documents 1 to 3).

These tabular soft magnetic metal particles are able to enhance the smoothness of the surface of coated films and soft magnetic particle/resin composites containing these particles. In addition, when a paint containing tabular soft magnetic metal particles is coated or when a soft magnetic metal/resin composite containing tabular soft magnetic metal particles is formed, the particles can align (orient) in parallel with a specific direction as a result of being subjected to an external magnetic field. Thus, due to orientation, together with lowering the demagnetizing coefficient in the planar direction of a coated film or soft magnetic metal/resin composite, magnetic permeability in the direction in which the soft magnetic metal particles are aligned can be enhanced.

In addition, since tabular soft magnetic metal particles have a thickness of 1 μm or less, they allow the passage of alternating current due to skin effects, thereby making it possible to reduce loss attributable to eddy current.

These tabular soft magnetic metal particles are typically produced by subjecting irregularly shaped particles produced by atomization to mechanical pulverization or plastic deformation.

Patent Document 1: Japanese Unexamined Patent Application, First Publication No. S63-35701
Patent Document 2: Japanese Patent No. 2735615
Patent Document 3: Japanese Unexamined Patent Application, First Publication No. H1-188606
Non-Patent Document 1: JCPDS Card 04-0850
Non-Patent Document 2: JCPDS Card 88-1715

DISCLOSURE OF THE INVENTION

Problems to be Solved by the Invention

When the shape of a soft magnetic alloy such as nickel-iron alloy is deformed to a tabular shape, magnetic permeability can increase as compared with a case wherein spherical particles of the same volume are used, since saturation magnetization can be reached in a smaller magnetic field in the direction of the long axis of the flat surface of the tabular particles. However, in general, the magnitude of saturation magnetization of particles is the same regardless of the shape in the case conditions such as the type of particles and volume thereof are the same. If it is possible to increase saturation magnetization with a method other than by changing volume and the like, the added amount of soft magnetic metal contained in coated films or soft magnetic metal/resin composites containing soft magnetic metal can be reduced, thereby making this advantageous industrially.

In order to solve the aforementioned problems, an object of the present invention is to provide nickel-iron-zinc alloy nanoparticles, which are able to have a larger saturation magnetization due to deformation to a tabular shape, in comparison with spherical particles before deformation.

Means for Solving the Problems

As a result of conducting extensive studies to solve the aforementioned problems, the inventors of the present invention found that by further alloying zinc with a nickel-iron alloy, crystal magnetic anisotropy can be imparted to nickel-iron alloy that is characterized by normally not having crystal magnetic anisotropy. Moreover, the inventors of the present also found that when this alloy is plastically deformed to a tabular shape by mechanical stress, plastic deformation preferentially occurs to a specific crystal plane, and since this specific crystal plane is a direction of easy magnetization of the alloy, particles which are deformed to a tabular shape can have greater saturation magnetization than spherical particles prior to deformation. The present invention was completed by the inventors on the basis of these findings.

Namely, a first aspect of the present invention relates to nickel-iron-zinc alloy nanoparticles in the form of tabular particles having a thickness of 1 μm or less and an aspect ratio of 2 or more, wherein the (220) plane which is the crystal plane of the face-centered cubic lattice is oriented on the tabular surface of the particles.

When the peak intensity of the (200) plane is defined as I(200) and the peak intensity of the (220) plane is defined as I(220) in an X-ray diffraction pattern measured on the aforementioned tabular surface, the aforementioned nickel-iron-zinc alloy nanoparticles of the present invention preferably satisfy the relation of I(220)/[I(220)+I(200)]>0.5.

A second aspect of the present invention relates to a production method of nickel-iron-zinc alloy nanoparticles in the form of tabular particles having a thickness of 1 µm or less and an aspect ratio of 2 or more, with the (220) plane which is the crystal plane of the face-centered cubic lattice and is oriented on the tabular surface of the particles, wherein the method is selected from the following (a), (b) and (c):

(a) a method comprising steps of; forming particles by adding a reducing agent to an aqueous solution containing a nickel salt, an iron salt and a zinc salt and simultaneously reducing nickel ions, iron ions and zinc ions contained in the aqueous solution; and forming nanoparticles by subjecting the formed particles to plastic deformation by applying mechanical stress;

(b) a method comprising steps of; forming particles by atomization; and forming nanoparticles by subjecting the formed particles to plastic deformation by applying mechanical stress; and, (c) a method comprising steps of; forming particles by gas phase synthesis; and forming nanoparticles by subjecting the formed particles to plastic deformation by applying mechanical stress.

Effects of the Invention

According to the nickel-iron-zinc alloy nanoparticles of the present invention, the nanoparticles are in the form of flat plates having a thickness of 1 µm or less and an aspect ratio of 2 or more, and the nanoparticles have the oriented crystal plane represented by the (220) plane of the face-centered cubic lattice on the tabular surface thereof, wherein the plane is the direction of easy magnetization. Accordingly, these nanoparticles have greater magnetic permeability than conventional nickel-ion alloy nanoparticles, and are able to reduce loss which is caused by eddy current. Moreover, since the oriented (220) plane, which is the crystal plane and is the direction of easy magnetization, exists on the tabular surface, large saturation magnetization is obtained in the case of applying a magnetic field in a specific direction.

Moreover, saturation magnetization can also be increased as a result of the peak intensity I(200) of the (200) plane and the peak intensity I(220) of the (220) plane in an X-ray diffraction pattern measured on the tabular surface satisfying the relation of I(220)/[I(220)+I(200)]>0.5.

BEST MODE FOR CARRYING OUT THE INVENTION

The present invention relates to nickel-iron-zinc alloy nanoparticles. More particularly, the present invention relates to nickel-iron-zinc alloy nanoparticles having superior soft magnetism and large saturation magnetization due to being in the form of tabular particles, and having high saturation magnetization and high magnetic permeability as a result of a specific oriented crystal plane existing at the tabular surface.

The following provides an explanation of the best mode of the nickel-iron-zinc alloy nanoparticles of the present invention.

Furthermore, although a detailed explanation of this mode is provided to ensure a better understanding of the gist of the present invention, the present invention is not limited thereto unless specifically stated otherwise.

The nickel-iron-zinc alloy nanoparticles of the present invention are in the form of tabular particles having a thickness of 1 µm or less and an aspect ratio of 2 or more, with the (220) plane, wherein the plane is the crystal plane of the face-centered cubic lattice and is also the direction of easy magnetization, and the (220) plane is oriented on the flat surface of the particles, or in other words, the tabular surface.

In the nickel-iron-zinc alloy nanoparticles of the present invention, the peak intensity I(200) of the (200) plane having a diffraction angle 2θ in the vicinity of 52° and the peak intensity I(220) of the (220) plane having a diffraction angle 2θ in the vicinity of 76° preferably have a specific relationship in which they satisfy the relation I(220)/[I(220)+I(200)]>0.5, in an X-ray diffraction pattern measured on the tabular surface. There are no limitations on the production method of the nickel-iron-zinc alloy nanoparticles of the present invention. More specifically, the relationship of 1>I(220)/[I(220)+I(200)]>0.5 is preferably satisfied in the present invention.

It has been reported that, in general, a face-centered cubic structure using nickel for the matrix satisfies I(220)<I(200) (see, for example, Non-Patent Documents 1 and 2).

However, the inventors of the present invention found that, when zinc is added to an alloy having a face-centered cubic structure wherein nickel is used as the matrix, and this alloy is plastically deformed into the shape of a tabular particle by mechanical stress, plastic deformation occurs such that the (220) plane is oriented on the tabular surface of the tabular particles, and furthermore, since an easy-magnetization surface is provided on the flat surface of the tabular particle, greater saturation magnetization is obtained as compared with spherical particles prior to deformation. In this way, the present invention was completed by the inventors.

Since the tabular nickel-iron-zinc alloy nanoparticles of the present invention are such that the (220) plane is oriented on the tabular surface, the intensity of an X-ray diffraction pattern measured on the tabular surface differs from that reported in the past, and the nanoparticles of the present invention satisfy (220)>I(200). A more detailed representation of this relationship yields the following formula (1).

$$I(220)/[I(220)+I(200)]>0.5 \quad (1)$$

The above formula is more preferably represented with the following formula.

$$1>I(220)/[I(220)+I(200)]>0.5.$$

Examples of methods for obtaining the nickel-iron-zinc alloy nanoparticles of the present invention include: (a) a method by which the nanoparticles are formed by adding a reducing agent to an aqueous solution containing a nickel salt, an iron salt and a zinc salt and simultaneously reducing nickel ions, iron ions and zinc ions contained in the aqueous solution to form particles, and subjecting the formed particles to plastic deformation by applying mechanical stress, (b) a method for forming the nanoparticles by subjecting particles formed by atomization to plastic deformation by applying mechanical stress, and (c) a method for forming the nanoparticles by subjecting particles formed by gas phase synthesis to plastic deformation by applying mechanical stress. However, it is possible to use a method other than those indicated above.

The nickel-iron-zinc alloy nanoparticles of the present invention may also be produced by adding, for example, molybdenum (Mo), chromium (Cr), cobalt (Co), manganese (Mn), vanadium (V), niobium (Nb) and/or copper (Cu) to further increase magnetic permeability. The amount thereof can be selected as necessary.

The following indicates an example of the method (a), wherein a reducing agent is added to an aqueous solution, as a method for producing the nickel-iron-zinc alloy nanoparticles of the present invention.

There are no particular limitations on the nickel salt used for the nickel-iron-zinc alloy nanoparticles of the present invention insofar as the salt is soluble in water. Examples of nickel salts include nickel chloride ($NiCl_2$), nickel nitrate ($Ni(NO_3)_2$), nickel acetate ($Ni(CH_3COO)_2$) and nickel sulfate ($NiSO_4$).

The iron salt used in the nickel-iron-zinc alloy nanoparticles of the present invention may have a valence of 2 or 3 insofar as the salt is soluble in water, and examples thereof include ferrous chloride ($FeCl_2$), ferric chloride ($FeCl_3$), ferrous nitrate ($Fe(NO_3)_2$), ferric nitrate ($Fe(NO_3)_3$), ferrous acetate ($Fe(CH_3CO_2)_2$), ferric acetate ($Fe(CH_3CO_2)_3$), ferrous sulfate ($FeSO_4$) and ferric sulfate ($Fe_2(SO_4)_3$).

There are no particular limitations on the zinc salt used in the nickel-iron-zinc alloy nanoparticles of the present invention insofar as the salt is soluble in water. Examples thereof include zinc chloride ($ZnCl_2$), zinc nitrate ($Zn(NO_3)_2$), zinc acetate ($Zn(CH_3COO)_2$) and zinc sulfate ($ZnSO_4$).

When preparing such an aqueous solution of a nickel salt, iron salt and zinc salt, the amount of pure water used to dissolve the nickel salt, the iron salt and the zinc salt is selected as necessary. For example, 0.1 to 2 L of pure water is preferable for 0.1 moles of metal ions (nickel ions ($Ni^{2+}$), iron ions ($Fe^{2+}$, $Fe^{3+}$) and zinc ions ($Zn^{2+}$)). 0.15 to 0.6 L of pure water is more preferable.

The reason why 0.1 to 2 L to 0.1 moles of metal ions (nickel ions ($Ni^{2+}$), iron ions ($Fe^{2+}$, $Fe^{3+}$) and zinc ions ($Zn^{2+}$)) is preferable for the amount of pure water used to dissolve the nickel salt, iron salt and zinc salt is that if the amount of pure water is less than 0.1 L, the amount of crystal nuclei of the nickel-iron-zinc alloy becomes excessively large, and since nickel-iron-zinc alloy nanoparticles grow while being too close to each other, aggregation occurs easily. On the other hand, if the amount of pure water exceeds 2 L, the amount of formed crystal nuclei of the nickel-iron-zinc alloy nanoparticles is low during reduction of nickel ions, iron ions and zinc ions contained in the aqueous solution of nickel salt, iron salt and zinc salt by the reducing agent, thereby facilitating the formation of coarse particles.

Among the mixing ratios of the nickel salt, iron salt and zinc salt, the amount of the iron salt added is suitably adjusted corresponding to the magnetic properties of the target nickel-iron-zinc alloy nanoparticles. The amount of the iron salt is preferably within the range of 10 to 60% by weight based on the salt mixture. The added amount is more preferably within the range of 20 to 55% by weight.

The reason for the added amount of the iron salt preferably being within the range of 10 to 60% by weight is that if the added amount of iron salt is less than 10% by weight, large saturation magnetization tends not to be obtained even if there is plastic deformation in a specific crystal plane, while if the amount of iron salt added exceeds 60% by weight, the crystal structure ends up being a body-centered cubic structure, thereby preventing occurrence of the crystal plane orientation of the present invention.

Among the mixing ratios of the nickel salt, iron salt and zinc salt, the amount of the zinc salt added is preferably within the range of 2 to 10% by weight based on the salt mixture. The added amount is more preferably within the range of 3 to 5% by weight.

The reason for the added amount of the zinc salt preferably being within the range of 2 to 10% by weight is that if the added amount of the zinc salt is less than 2% by weight, the ability of the nickel-iron-zinc alloy nanoparticles to undergo plastic deformation in a specific crystal plane tends not to be adequately obtained, while if the added amount of the zinc salt exceeds 10% by weight, due to the small magnetic moment of the zinc atoms themselves, saturation magnetization prior to plastic deformation ends up decreasing, thereby tending towards large saturation magnetization not being obtained even if there is plastic deformation in a specific crystal plane.

Moreover, when producing the nickel-iron-zinc alloy nanoparticles of the present invention, about 10 to 40% by volume of a water-soluble alcohol such as methanol or ethanol is preferably added to the pure water used to dissolve the nickel salt, iron salt and zinc salt. If a prescribed amount of a water-soluble alcohol is added to the pure water used to dissolve the nickel salt, iron salt and zinc salt in this manner, it becomes easier to form crystal nuclei of the nickel-iron-zinc alloy during the reduction reaction of nickel ions, iron ions and zinc ions, thereby making this preferable.

Examples of reducing agents able to be used when producing the nickel-iron-zinc alloy nanoparticles of the present invention include those that demonstrate reducing power in an aqueous solution of a nickel salt, iron salt and zinc salt. The reducing agent can be selected as necessary, and several reducing agents may also be combined as necessary. Examples of reducing agents include hydrazine ($N_2H_4$), alkaline hydroxides, sodium formaldehyde sulfoxylate and boron hydride metal salts.

Since comparatively powerful reducing power is obtained when producing the nickel-iron-zinc alloy nanoparticles of the present invention, the combined use of an alkaline hydroxide and hydrazine is preferable for the reducing agent.

In the case of using an alkaline hydroxide and hydrazine for the reducing agent, the amount of the alkaline hydroxide added is preferably 5 to 10 times and more preferably 5.5 to 7 times the total molar amount of nickel ions and iron ions in the aqueous solution of the nickel salt, iron salt and zinc salt.

The reason that the added amount of alkaline hydroxide is preferably 5 to 10 times the total molar amount of nickel ions, iron ions and zinc ions in the aqueous solution of the nickel salt, iron salt and zinc salt is that if the added amount of alkaline hydroxide is less than 5 times the total molar amount, a highly alkaline pH of 12 or higher at which hydrazine demonstrates adequate reduction is not reached, while if the added amount of alkaline hydroxide exceeds 10 times the total molar amount, there is little change in the pH.

In addition, in the case of using an alkaline hydroxide and hydrazine for the reducing agent, the added amount of hydrazine is preferably 2 to 50 times and more preferably 5 to 30 times the total molar amount of nickel ions, iron ions and zinc ions in the aqueous solution of the nickel salt, iron salt and zinc salt.

The reason that the added amount of hydrazine is preferably 2 to 50 times the molar amount of nickel ions, iron ions and zinc ions in the aqueous solution of the nickel salt, iron salt and zinc salt is that if the added amount of hydrazine is less than 2 times the total molar amount, the reduction reaction of the nickel ions, iron ions and zinc ions does not proceed adequately, while even if the added amount of hydrazine exceeds 50 times the total molar amount, unreacted hydrazine simply remains, and there is no change in the nickel-iron-zinc alloy nanoparticles formed.

In addition, when producing the nickel-iron-zinc alloy nanoparticles of the present invention, the aqueous solution of the nickel salt, iron salt and zinc salt is preferably heated to 50 to 80° C. and more preferably to 55 to 65° C. after having added the predetermined amount of reducing agent to the aqueous solution of the nickel salt, iron salt and zinc salt in order to increase the reaction rate of the reduction reaction of nickel ions, iron ions and zinc ions by the reducing agent and efficiently form nickel-iron-zinc alloy nanoparticles in the aqueous solution of the nickel salt, iron salt and zinc salt.

If the temperature to which the aqueous solution of the nickel salt, iron salt and zinc salt is heated following addition of the reducing agent is lower than 50° C., since progression of the reduction reaction of the nickel ions, iron ions and zinc ions slows, the formation efficiency of the nickel-iron-zinc alloy nanoparticles tends to become poor. On the other hand, if the temperature to which the aqueous solution of the nickel salt, iron salt and zinc salt is heated following addition of the reducing agent exceeds 80° C., there is the risk of the nickel-iron-zinc alloy nanoparticles formed being oxidized.

In addition, the duration of heating of the aqueous solution of the nickel salt, iron salt and zinc salt to 50 to 80° C. following addition of the prescribed amount of reducing agent to the aqueous solution of the nickel salt, iron salt and zinc salt is selected as necessary. The heating time is preferably 1 to 10 hours and more preferably 2 to 5 hours.

As a result of heating the aqueous solution of the nickel salt, iron salt and zinc salt to within the range of 50 to 80° C. for 1 to 3 hours after having added the predetermined amount of reducing agent to the aqueous solution of the nickel salt, iron salt and zinc salt in this manner, black particles are formed when the reduction reaction of the nickel ions, iron ions and zinc ions starts. Although varying according to the conditions, the size of the black particles at this time is, for example, about 100 to 500 nm. In addition, the aqueous solution of the nickel salt, iron salt and zinc salt is preferably heated while stirring following addition of the reducing agent so that the reduction reaction of the nickel ions, iron ions and zinc ions proceeds evenly.

Nickel-iron-zinc alloy nanoparticles are obtained from black particles which are generated in this manner, after removal of impurity ions and drying are conducted as necessary. Although varying according to the conditions, the size of the obtained particles at this time is, for example, about 100 to 500 nm. The method used to remove impurity ions from the nickel-iron-zinc alloy nanoparticles can be selected as necessary, and examples thereof include a method wherein the nickel-iron-zinc alloy nanoparticles are dispersed in pure water followed by filtering, and such a step is repeated one or more times.

The nickel-iron-zinc alloy nanoparticles obtained in this manner are subjected to plastic deformation by applying mechanical stress. As a result thereof, tabular nickel-iron-zinc alloy nanoparticles are obtained that are plastically deformed in a specific crystal plane.

Devices for applying mechanical stress to the nickel-iron-zinc alloy nanoparticles can be selected as necessary, and for example, a wet mixing machine such as a ball mill, atriter, vibrating mill or planetary mill, or a rolling mill or powder forging machine can be used. Since the ability to undergo plastic deformation is enhanced considerably by the addition of zinc, in the case of machines able to apply a high level of energy as is the case with an atriter or vibrating mill, adequate caution is required since there is a possibility of the particles being crushed simultaneous to flattening. A wet mixing machine is preferable in consideration being able to effectively apply effective energy without subjecting the nickel-iron-zinc alloy nanoparticles to strong impacts, handling ease and ease of increasing the production scale, and a ball mill is particularly preferable among wet mixing machines.

In the case of using a ball mill, conditions can be selected as necessary. For example, the amount of balls filled into the mill is preferably 20 to 50% by volume of the volume of the ball mill.

In addition, it is preferable that the material of the balls does not have the risk of soiling the nickel-iron-zinc alloy nanoparticles while being able to effectively apply mechanical stress to the nanoparticles, and the material has a high specific gravity. Zirconia is particularly preferable as the material of balls from the viewpoints of corrosion resistance and the like.

In addition, although the weight of the nickel-iron-zinc alloy nanoparticles filled into the ball mill can be selected as necessary, it is preferably $1/100$ to $1/10$ the weight of the balls.

If the amount of nickel-iron-zinc alloy nanoparticles filled into the ball mill is less than $1/100$ the weight of the balls, the amount of the nickel-iron-zinc alloy nanoparticles relative to the balls becomes excessively low, thereby causing the nanoparticles to be crushed as a result of being subjected to excessive mechanical stress, and tending to prevent the formation of nickel-iron-zinc alloy nanoparticles of a predetermined tabular shape. On the other hand, if the amount of nickel-iron-zinc alloy nanoparticles filled into the ball mill exceeds $1/10$ the weight of the balls, the amount of nickel-iron-zinc alloy nanoparticles relative to the balls becomes excessively large, and since mechanical stress is unable to be applied effectively to the nanoparticles, the production efficiency of tabular nickel-iron-zinc alloy nanoparticles tends to become poor.

The duration of the application of mechanical stress for the nickel-iron-zinc alloy nanoparticles, wherein the mechanical stress is applied to cause plastic deformation of the nanoparticles, can be selected as necessary. In comparison with 10 or more hours of mechanical stress, which is required for nickel-iron alloy nanoparticles in order to cause plastic deformation thereof, the duration of mechanical stress required for the nanoparticles of the present invention is extremely short. Concrete examples of the duration for applying mechanical stress for the nickel-iron-zinc alloy nanoparticles include about 10 to 120 minutes.

In addition, an alcohol or organic solvent is preferably added when filling the nickel-iron-zinc alloy nanoparticles into a ball mill. The addition of an alcohol or organic solvent inhibits further crushing of the nickel-iron-zinc alloy nanoparticles and the formation of fine particles of the nanoparticles. The addition of an alcohol or organic solvent also makes it possible to promote the formation of tabular nickel-iron-zinc alloy nanoparticles by plastic deformation of the nickel-iron-zinc alloy nanoparticles. Moreover, the addition of an alcohol or organic solvent not only alleviates unevenness by preventing aggregation of the nickel-iron-zinc alloy nanoparticles, but also removes the oxide layer on the surface of the nanoparticles by a reduction reaction, thereby making it possible to facilitate adhesion between nanoparticles.

There are no particular limitations on the alcohol or organic solvent used when producing the tabular nickel-iron-zinc alloy nanoparticles of the present invention. A low boiling point alcohol such as methanol or ethanol or a volatile solvent such as toluene or xylene is preferable in consideration of ease of recovery after the reaction.

In addition, although the amount of alcohol or organic solvent added can be selected as necessary, it is preferably 2 to 5 times the weight of the nickel-iron-zinc alloy nanoparticles.

If the amount of solvent or organic solvent added is less than 2 times the weight of the nickel-iron-zinc alloy nanoparticles, effects such as inhibition of the formation of excessively fine particles, which are formed from nickel-iron-zinc alloy nanoparticles, prevention of aggregation of the nickel-iron-zinc alloy nanoparticles, and removal of the oxide layer on the surface of the nickel-iron-zinc alloy nanoparticles tend to not be adequately obtained. On the other hand, if the amount of alcohol or organic solvent added exceeds 5 times the weight of the nickel-iron-zinc alloy nanoparticles, this only results in an increase in treatment time, and there is no change in the resulting tabular nickel-iron-zinc alloy nanoparticles.

The thickness of the tabular nickel-iron-zinc alloy nanoparticles of the present invention is 1 µm or less and the aspect ratio is 2 or more.

The thickness of the nickel-iron-zinc alloy nanoparticles of the present invention is preferably 1 µm or less, more preferably 0.5 µm or less and even more preferably 0.2 µm or less.

The reason that the thickness of the nickel-iron-zinc alloy nanoparticles of the present invention is preferably 1 µm or less is that if the thickness exceeds 1 µm, loss caused by eddy current cannot be adequately reduced.

In addition, the aspect ratio of the nickel-iron-zinc alloy nanoparticles of the present invention is preferably 2 or more, more preferably 5 or more, and even more preferably 10 or more.

The reason that the aspect ratio of the nickel-iron-zinc alloy nanoparticles of the present invention is preferably 2 or more is that if the aspect ratio is less than 2, magnetic permeability in the direction of the orientation cannot be adequately enhanced.

The nickel-iron-zinc alloy nanoparticles of the present invention can be oriented so as to face in the same direction by applying an external magnetic field. Along the direction in which planes of the tabular nanoparticles are oriented, saturation magnetization can be reached with a weaker magnetic field than that of spherical nickel-iron-zinc alloy nanoparticles of the same volume. Accordingly, the nickel-iron-zinc alloy nanoparticles of the present invention have considerably larger magnetic permeability in a direction in the plane thereof, in comparison with the magnetic permeability of spherical nickel-iron-zinc alloy nanoparticles of the same volume. As a result, a material having high magnetic permeability can be easily obtained that demonstrates strong magnetism with respect to a magnetic field of a specific direction.

Moreover, with respect to an X-ray diffraction pattern measured on a tabular surface, in the tabular nickel-iron-zinc alloy nanoparticles of the present invention, the peak intensity I(220) of the (220) plane is much larger than the peak intensity I(200) of the (200) plane. On the other hand, in ordinary nickel-iron alloy nanoparticles and nickel-iron-zinc alloy nanoparticles prior to plastic deformation, the peak intensity I(220) of the (220) plane is smaller than the peak intensity I(200) of the (200) plane. Consequently, plastic deformation can be confirmed to be occurring in a specific crystal plane of the nanoparticles of the present invention. In the nickel-iron-zinc alloy nanoparticles of the present invention, the value of saturation magnetization is larger than that of ordinary nickel-iron alloy nanoparticles and nickel-iron-zinc alloy nanoparticles prior to plastic deformation.

In addition, since the nickel-iron-zinc alloy nanoparticles of the present invention is a material having high magnetic permeability, a soft magnetic metal/resin composite having high magnetic permeability can be obtained by dispersing and orienting the nanoparticles in the form of filler in a non-magnetic material such as a resin.

In addition, a paint or paste can be obtained by dispersing the nickel-iron-zinc alloy nanoparticles of the present invention in a non-polar solvent. Such paints and pastes are able to impart magnetic shielding property to electrical devices, IC tags (RFID systems) and the like by coating onto these electrical devices, IC tags (RFID systems) and the like to form a magnetic shielding film.

Moreover, since the nickel-iron-zinc alloy nanoparticles of the present invention have large saturation magnetization, the amount added to paint or paste can be increased.

Furthermore, each of the conditions of the nickel-iron-zinc alloy nanoparticles of the present invention may be selected as necessary. As a preferable example thereof, the average length in the direction of the long axis on the flat surface of the nickel-iron-zinc alloy nanoparticles of the present invention is preferably 0.2 to 5 µm, and the average length in the direction of the short axis is 0.1 to 0.5 µm. Moreover, the saturation magnetization of the nickel-iron-zinc alloy nanoparticles is preferably 70 to 110 emu/g and more preferably 80 to 105 emu/g.

In addition, it is preferable for a soft magnetic metal/resin composite in which the nickel-iron-zinc alloy nanoparticles of the present invention have been added as filler to a resin at 35% by volume that the real number portion of alternating current magnetic permeability at 1 GHz is 5 to 30 and more preferably 8 to 15. Magnetic loss which is the ratio between the real number portion and the imaginary number portion of alternating current magnetic permeability is preferably 0.01 to 0.2, and sheet resistance is preferably 1000Ω☐ or more.

In addition, since the nickel-iron-zinc alloy nanoparticles of the present invention are made of metal and consequently have electrical conductivity, they are preferable for use as electrode materials in circuit substrates and as electrode materials of fuel cells and secondary batteries.

Moreover, since the nickel-iron-zinc alloy nanoparticles of the present invention are in the form of tabular particles and consequently have superior concealability, they can be applied to various decorative articles or surface treatments and the like.

EXAMPLES

Although the following provides a more detailed explanation of the present invention through examples thereof, the present invention is not limited to the following examples.

Example 1

35.5 g of nickel chloride hexahydrate ($NiCl_2 \cdot 6H_2O$, special grade reagent, Kanto Chemical Co., Inc.), 7.9 g of ferrous chloride tetrahydrate ($FeCl_2 \cdot 4H_2O$, special grade reagent, Kanto Chemical Co., Inc.) and 3.2 g of zinc nitrate hexahydrate ($Zn(NO_3)_2 \cdot 6H_2O$) were dissolved in a mixed solution of 300 mL of pure water and 200 mL of methanol to prepare an aqueous solution of nickel chloride, ferrous chloride and zinc nitrate.

Next, 200 mL of an aqueous sodium hydroxide solution having a concentration of 6 mol/L were added to this aqueous solution while stirring.

Next, this aqueous solution was heated to 60° C. while stirring followed by the addition of 300 g of hydrazine monohydrate ($N_2H_4 \cdot H_2O$, special grade reagent, Kanto Chemical Co., Inc.) and heating these aqueous solutions for 3 hours at 60° C. while stirring to obtain black particles.

Next, the black particles were washed with pure water and ethanol and then dried in a vacuum to obtain fine particles.

When electron micrographs of the resulting fine particles were obtained with a Model S-4000 Field Emission Scanning Electron Microscope (FE-SEM) (JEOL Ltd.), the fine particles were determined to be spherical.

Figure 1:
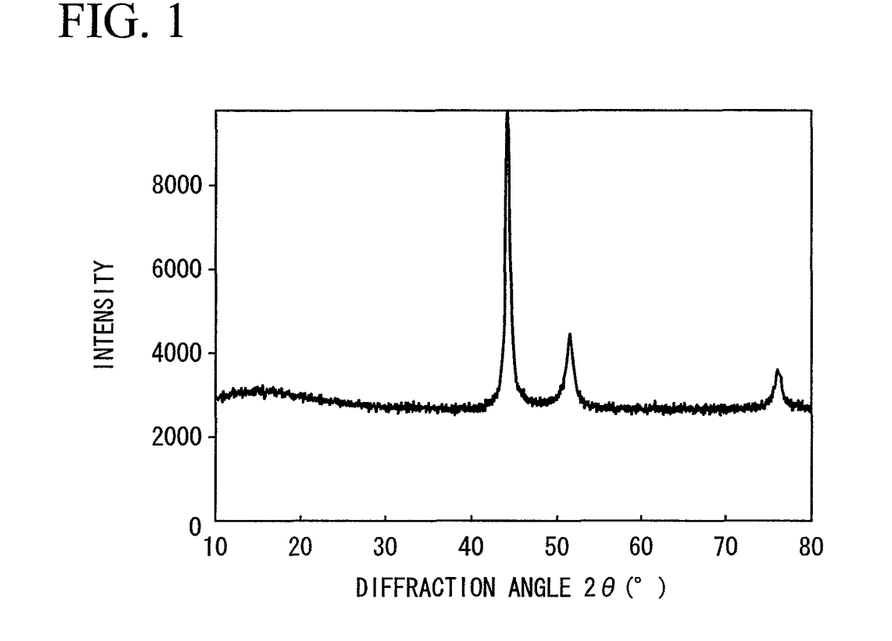
FIG. 1 is a drawing showing an X-ray diffraction profile of fine particles of Example 1 of the present invention.

As a result of analyzing these spherical fine particles with an X-ray diffraction analyzer (PANalytical Corp.), the X-ray diffraction pattern (XRD) shown in FIG. 1 was obtained.

The peak intensity I(200) of the (200) plane and the peak intensity I(220) of the (220) plane were found to satisfy the following relationship of formula (2) on the basis of this X-ray diffraction pattern.

$$I(220)/[I(220)+I(200)]=0.35 \quad (2)$$

Figure 2:
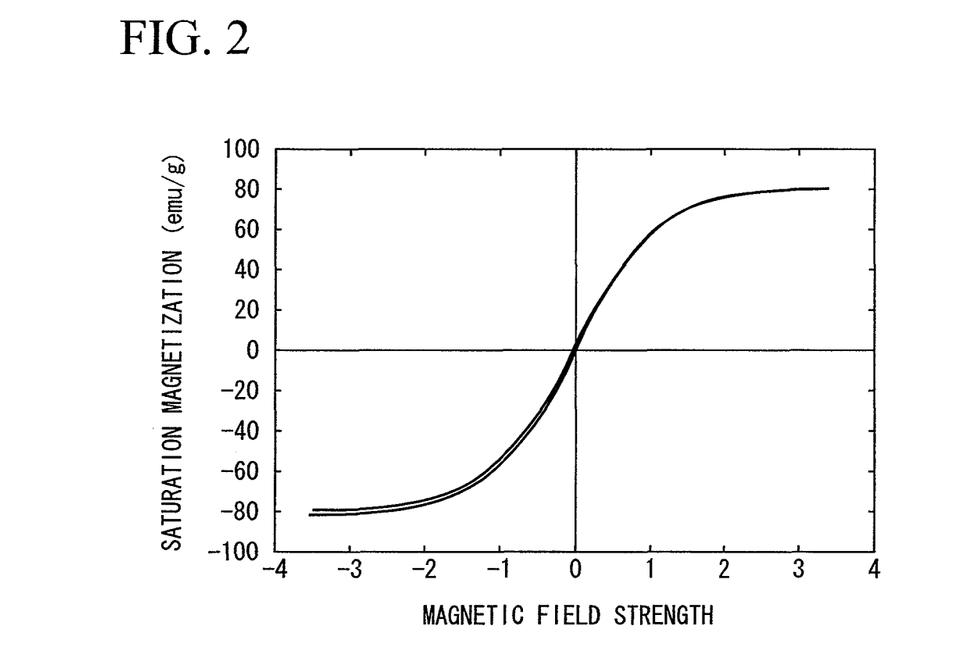
FIG. 2 is a drawing showing a hysteresis curve of fine particles of Example 1 of the present invention.

In addition, the saturation magnetization of these nickel, iron and zinc alloy particles was measured with a vibrating sample magnetometer (VSM) (Hayama Co., Ltd.). The hysteresis curve shown in FIG. 2 was obtained as a result of that measurement. The saturation magnetization was determined to be 81 emu/g based on this hysteresis curve.

Next, 1 g of these nickel, iron and zinc alloy particles, 12 g of zirconia balls having a diameter of 0.4 mm, and 10 g of ethanol were filled into a resin-container having a volume of 75 mL, and the container was rotated for 30 minutes with a ball mill to apply mechanical stress to the nickel, iron and zinc alloy particles.

When an electron micrograph of the resulting nickel, iron and zinc alloy particles was obtained with a scanning electron microscope (SEM), the resulting fine particles were tabular and had a thickness of 1 µm or less and an aspect ratio of 2 or more.

Figure 3:
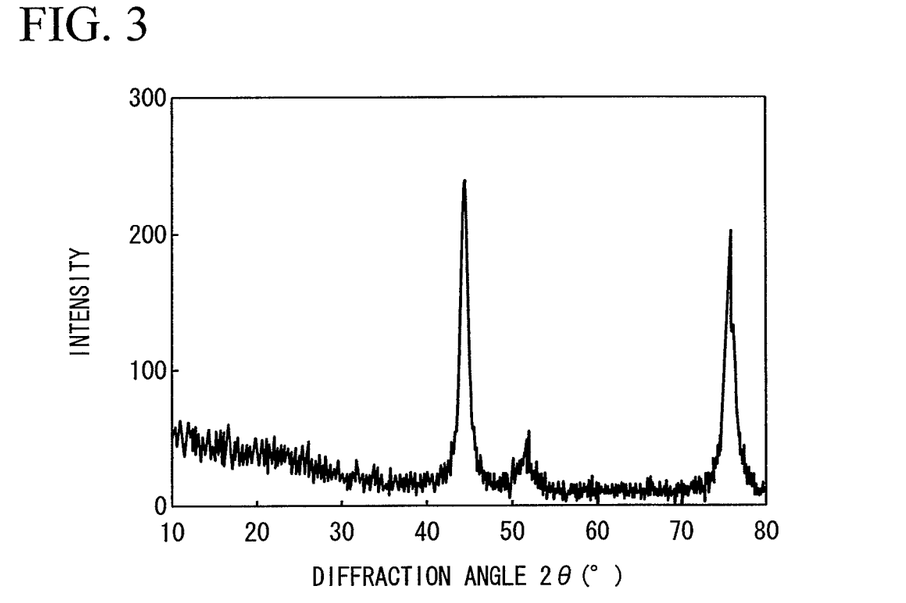
FIG. 3 is a drawing showing an X-ray diffraction profile of fine particles of Example 1 of the present invention.

The X-ray diffraction pattern shown in FIG. 3 was obtained as a result of placing the tabular fine particles on a flat surface by applying a magnetic field thereto and analyzing the fine particles from their upper surface by X-ray diffraction (XRD).

On the basis of this X-ray diffraction pattern, the peak intensity I(200) of the (200) plane and the peak intensity I(220) of the (220) plane were found to satisfy the relationship of the following formula (3).

$$I(220)/[I(220)+I(200)]=0.8 \quad (3)$$

Since the peak intensity ratio of this result differed from the peak intensity ratio of the X-ray diffraction pattern of FIG. 1, orientation in a specific crystal plane was determined to have occurred.

Figure 4:
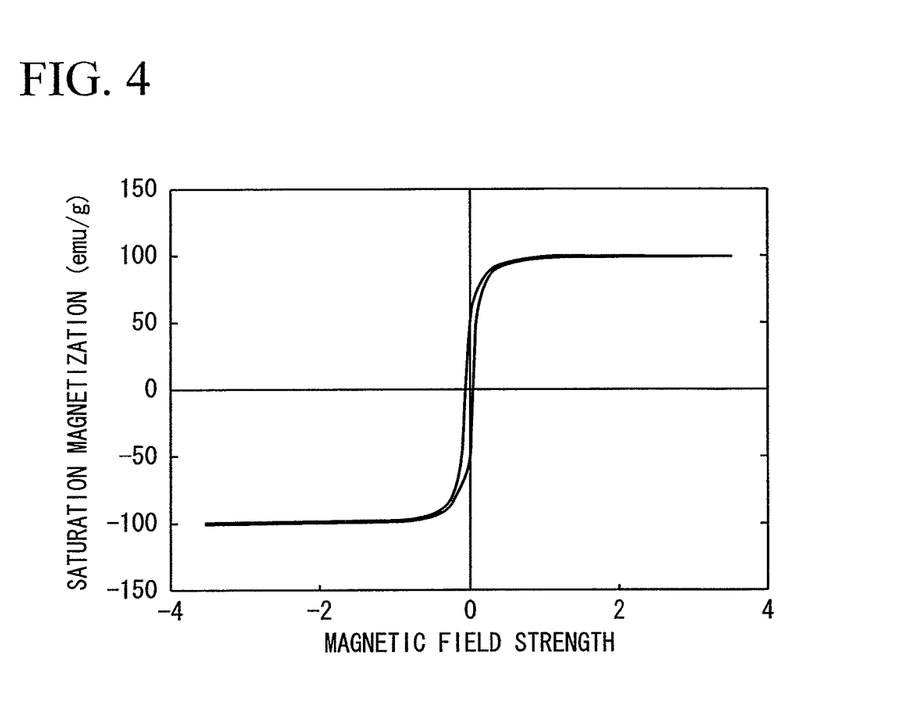
FIG. 4 is a drawing showing a hysteresis curve of fine particles of Example 1 of the present invention.

In addition, magnetic saturation was measured with a vibrating sample magnetometer (VSM) for the case wherein a magnetic field was applied in a direction parallel to the flat surface of the tabular nickel, iron and zinc alloy particles oriented on the flat surface. The hysteresis curve shown in FIG. 4 was obtained as a result of the measurement. On the basis of this hysteresis curve, magnetic permeability was determined to have increased since the magnetic field that reached saturation magnetization became smaller. In addition, saturation magnetization was 101 emu/g, and this was larger than the value of the hysteresis curve of FIG. 2.

Example 2

Nickel, iron and zinc alloy particles were obtained in the same manner as Example 1 with the exception of rotating the ball mill for 50 minutes.

When an electron micrograph of the resulting nickel, iron and zinc alloy particles was obtained with a scanning electron microscope (SEM), the resulting fine particles were flat and had a thickness of 1 µm or less and an aspect ratio of 2 or more.

Figure 5:
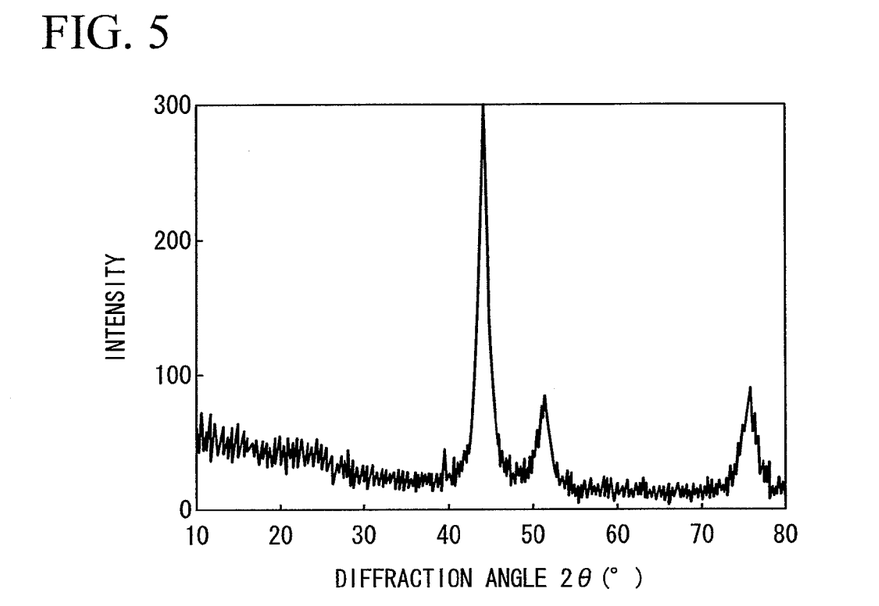
FIG. 5 is a drawing showing an X-ray diffraction profile of fine particles of Example 2 of the present invention.

The X-ray diffraction pattern shown in FIG. 5 was obtained as a result of providing the tabular fine particles on a flat surface by applying a magnetic field thereto and analyzing the fine particles from their upper surface by X-ray diffraction (XRD).

On the basis of this X-ray diffraction pattern, the peak intensity I(200) of the (200) plane and the peak intensity I(220) of the (220) plane were found to satisfy the relationship of the following formula (4).

$$I(220)/[I(220)+I(200)]=0.54 \quad (4)$$

Since the peak intensity ratio of this result differed from the peak intensity ratio of the X-ray diffraction pattern of FIG. 1, orientation in a specific crystal plane was determined to have occurred.

Figure 6:
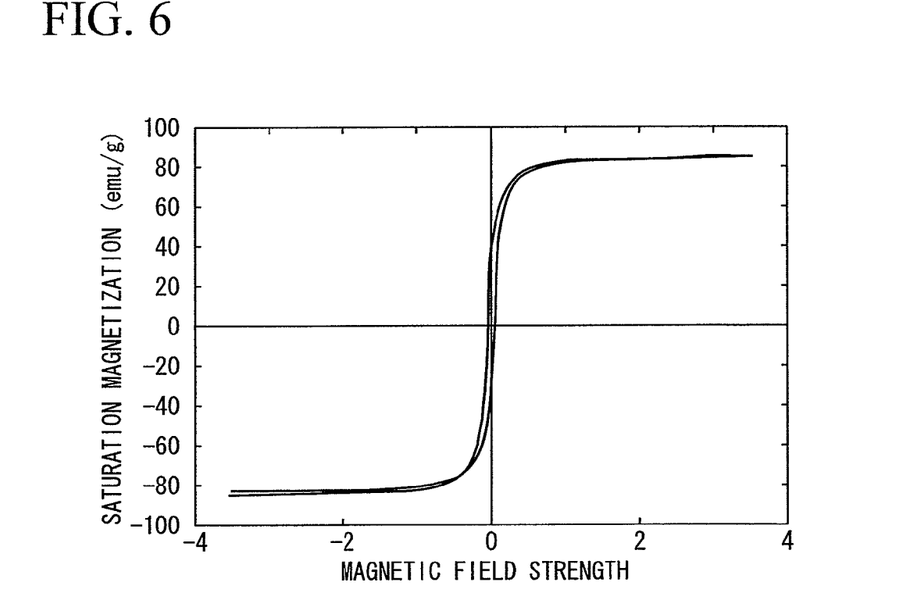
FIG. 6 is a drawing showing a hysteresis curve of fine particles of Example 2 of the present invention.

In addition, magnetic saturation was measured with a vibrating sample magnetometer (VSM) for the case wherein a magnetic field was applied in a direction parallel to the flat surface of the tabular nickel, iron and zinc alloy particles oriented on the flat surface. The hysteresis curve shown in FIG. 6 was obtained as a result of that measurement. On the basis of this hysteresis curve, magnetic permeability was determined to have increased since the magnetic field that reached saturation magnetization became smaller. In addition, saturation magnetization was 85 emu/g, and this was larger than the value of the hysteresis curve of FIG. 2.

Comparative Example 35.5 g of nickel chloride hexahydrate ($NiCl_2 \cdot 6H_2O$, special grade reagent, Kanto Chemical Co., Inc.) and 7.9 g of ferrous chloride tetrahydrate ($FeCl_2 \cdot 4H_2O$, special grade reagent, Kanto Chemical Co., Inc.) were dissolved in a mixed solution of 480 mL of pure water and 200 mL of methanol to prepare an aqueous solution of nickel chloride and ferrous chloride.

Next, 200 mL of an aqueous sodium hydroxide solution having a concentration of 6 mol/L were added to this aqueous solution while stirring.

Next, this aqueous solution was heated to 60° C. while stirring followed by the addition of 120 g of hydrazine monohydrate ($N_2H_4 \cdot H_2O$, special grade reagent, Kanto Chemical Co., Inc.) and heating these aqueous solutions for 3 hours at 60° C. while stirring to obtain black particles.

Next, the black particles were washed with pure water and ethanol and then dried in a vacuum to obtain fine particles.

When electron micrographs of the resulting fine particles were obtained with a scanning electron microscope (SEM), the fine particles were determined to be spherical.

Figure 7:
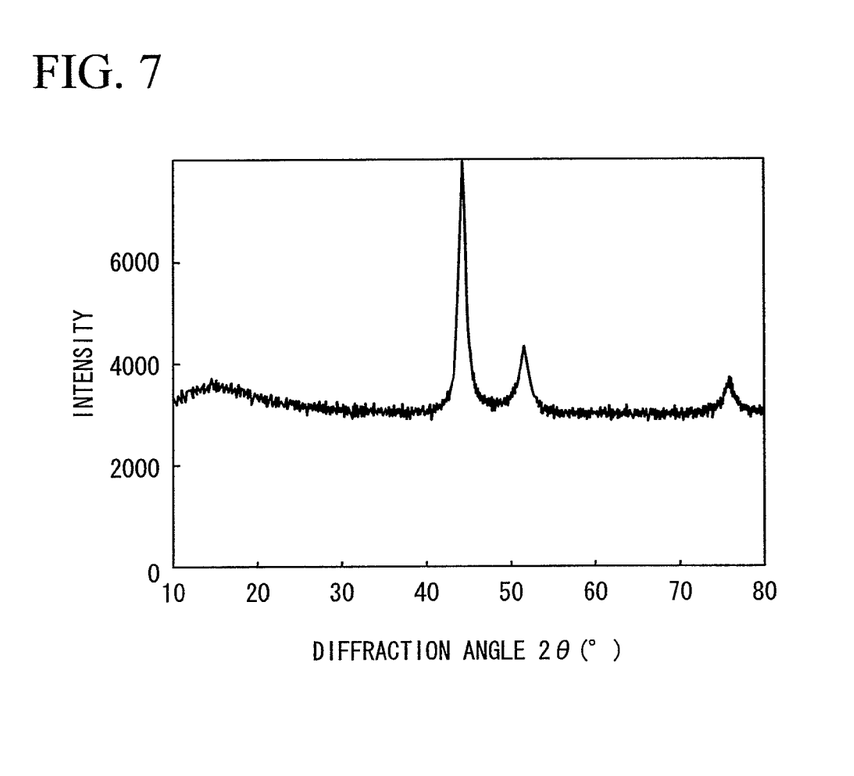
FIG. 7 is a drawing showing an X-ray diffraction profile of fine particles of a comparative example of the present invention.

As a result of analyzing these spherical fine particles by X-ray diffraction (XRD), the X-ray diffraction pattern shown in FIG. 7 was obtained.

The peak intensity I(200) of the (200) plane and the peak intensity I(220) of the (220) plane were found to satisfy the following relationship of formula (5) on the basis of this X-ray diffraction pattern.

$$I(220)/[I(220)+I(200)]=0.37 \tag{5}$$

Figure 8:
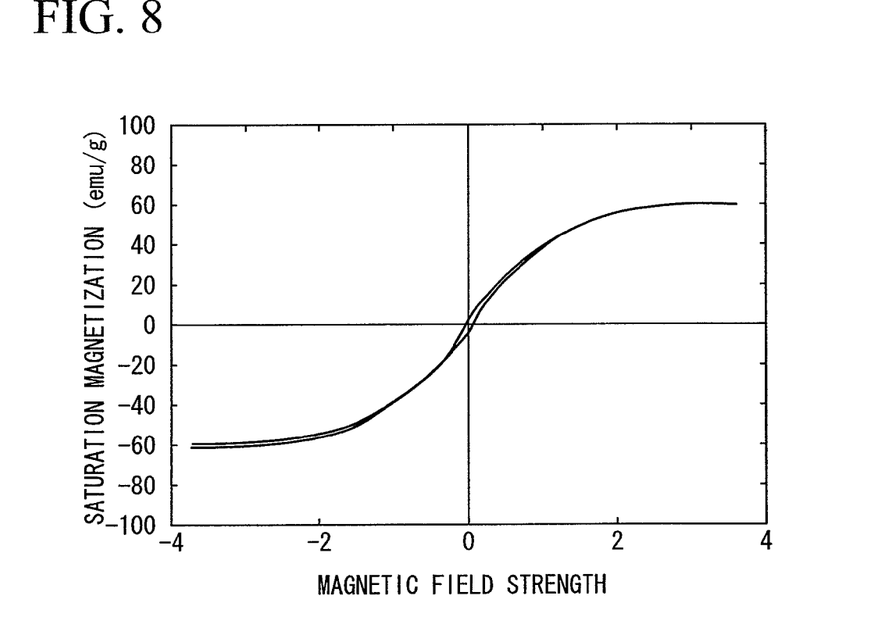
FIG. 8 is a drawing showing a hysteresis curve of fine particles of a comparative example of the present invention.

In addition, the saturation magnetization of these nickel and iron alloy particles was measured with a vibrating sample magnetometer (VSM). The hysteresis curve shown in FIG. 8 was obtained as a result of that measurement. The saturation magnetization was determined to be 60 emu/g based on this hysteresis curve.

Next, 1 g of these nickel and iron alloy particles, 12 g of zirconia balls having a diameter of 0.4 mm, and 10 g of ethanol were filled into a resin container having a volume of 75 mL, and the container was rotated for 50 hours with a ball mill to apply mechanical stress to the nickel and iron alloy particles.

When an electron micrograph of the resulting nickel and iron alloy particles was obtained with a scanning electron microscope (SEM), the resulting fine particles were flat and had a thickness of 1 μm or less and an aspect ratio of 2 or more.

Figure 9:
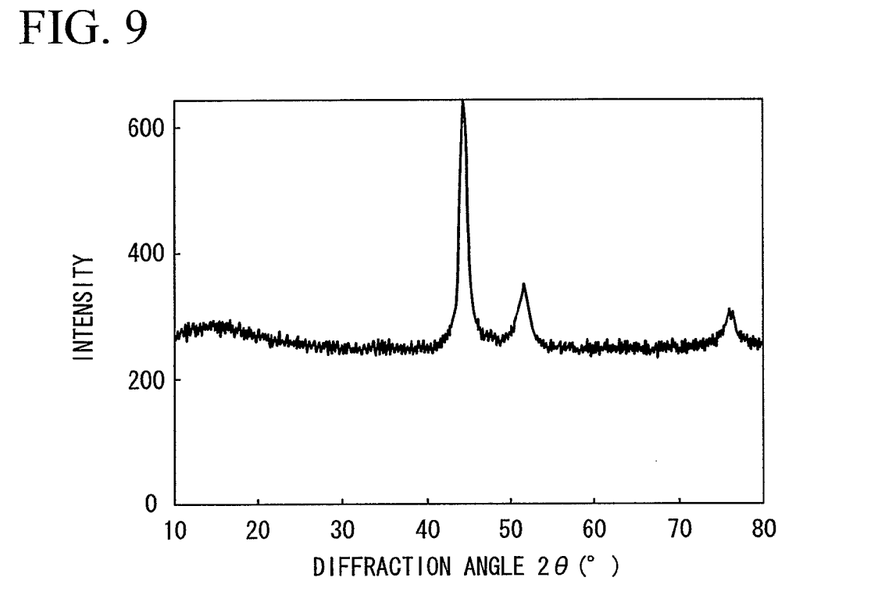
FIG. 9 is a drawing showing an X-ray diffraction profile of fine particles of a comparative example of the present invention.

The X-ray diffraction pattern shown in FIG. 9 was obtained as a result of providing the tabular fine particles on a flat surface by applying a magnetic field thereto and analyzing the fine particles from their upper surface by X-ray diffraction (XRD).

On the basis of this X-ray diffraction pattern, the peak intensity I(200) of the (200) plane and the peak intensity I(220) of the (220) plane were found to satisfy the relationship of the following formula (6).

$$I(220)/[I(220)+I(200)]=0.40 \tag{6}$$

This result was nearly the same as that of the X-ray diffraction pattern of FIG. 7.

Figure 10:
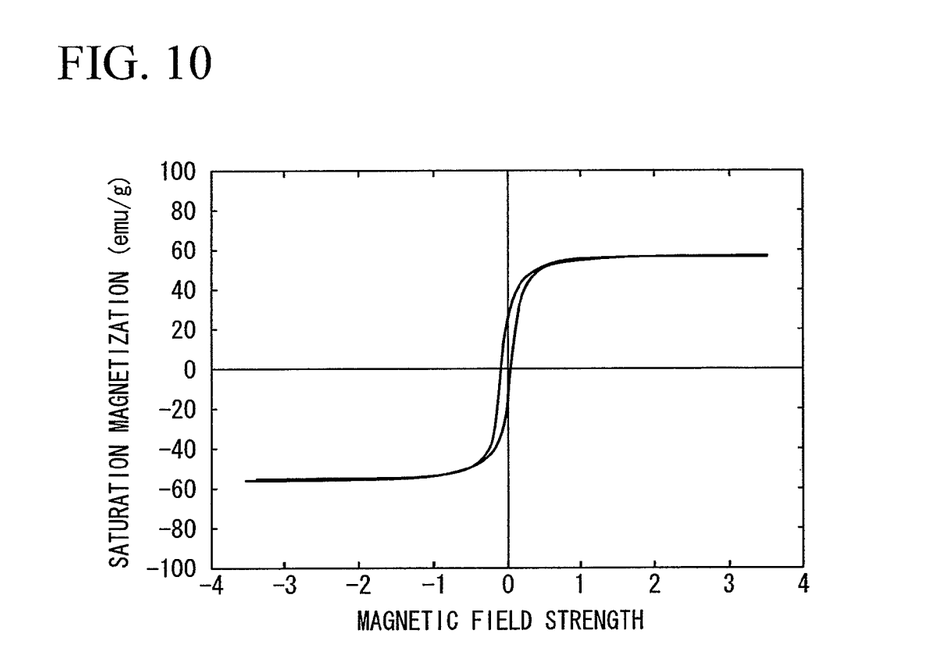
FIG. 10 is a drawing showing a hysteresis curve of fine particles of a comparative example of the present invention.

In addition, magnetic saturation was measured with a vibrating sample magnetometer (VSM) for the case wherein a magnetic field was applied in a direction parallel to the flat surface of the tabular nickel, iron and zinc alloy particles oriented on the flat surface. The hysteresis curve shown in FIG. 10 was obtained as a result of that measurement. On the basis of this hysteresis curve, magnetic permeability was determined to have increased since the magnetic field that reached saturation magnetization became smaller. However, saturation magnetization was only 58 emu/g, and this value was nearly the same as the value of the hysteresis curve of FIG. 8.

A comparison between Examples 1 and 2 and the Comparative Example confirmed that large saturation magnetization is able to be obtained in Examples 1 and 2, wherein zinc was used, when tabular particles are arranged on a flat surface while oriented in a specific crystal plane.

INDUSTRIAL APPLICABILITY

Nickel-iron-zinc alloy nanoparticles are provided that have larger saturation magnetization than spherical particles prior to deformation as a result of being deformed into the shape of tabular plates.

The invention claimed is:

1. Nickel-iron-zinc alloy nanoparticles in the form of tabular particles having a thickness of 1 μm or less and an aspect ratio of 2 or more, wherein the (220) plane which is the crystal plane of the face-centered cubic lattice is oriented on the tabular surface of the particles.

2. The nickel-iron-zinc alloy nanoparticles according to claim 1, wherein when the peak intensity of the (200) plane is defined as I(200) and the peak intensity of the (220) plane is defined as I(220) in an X-ray diffraction pattern measured on the tabular surface, the nickel-iron-zinc alloy nanoparticles satisfy the relation of I(220)/[I(220)+I(200)]>0.5.

3. The nickel-iron-zinc alloy nanoparticles according to claim 1, wherein the thickness of the nickel-iron-zinc alloy nanoparticles is 0.5 μm or less.

4. The nickel-iron-zinc alloy nanoparticles according to claim 1, wherein the thickness of the nickel-iron-zinc alloy nanoparticles is 0.2 μm or less.

5. The nickel-iron-zinc alloy nanoparticles according to claim 1, wherein the aspect ratio of the particles is 5 or more.

6. The nickel-iron-zinc alloy nanoparticles according to claim 1, wherein the aspect ratio of the particles is 10 or more.

7. The nickel-iron-zinc alloy nanoparticles according to claim 1, further containing at least one metal selected from the group consisting of molybdenum, chromium, cobalt, manganese, vanadium, niobium and copper.

8. A production method of nickel-iron-zinc alloy nanoparticles in the form of tabular plates having a thickness of 1 μm or less and an aspect ratio of 2 or more, with the (220) plane, which is the crystal plane of the face-centered cubic lattice and is oriented on the tabular surface of the particles, wherein the method is selected from the following (a), (b) and (c):

(a) a method comprising steps of; forming particles by adding a reducing agent to an aqueous solution containing a nickel salt, an iron salt and a zinc salt and simultaneously reducing nickel ions, iron ions and zinc ions contained in the aqueous solution; and forming nanoparticles by subjecting the formed particles to plastic deformation by applying mechanical stress;

(b) a method comprising steps of; forming particles by atomization; and forming nanoparticles by subjecting the formed particles to plastic deformation by applying mechanical stress; and, (c) a method comprising steps of; forming particles by gas phase synthesis; and forming nanoparticles by subjecting the formed particles to plastic deformation by applying mechanical stress.

9. The production method of nickel-iron-zinc alloy nanoparticles according to claim 8, wherein when the peak intensity of the (200) plane having a diffraction angle 2θ in the vicinity of 52° is defined as I(200), and the peak intensity of the (220) plane having a diffraction angle 2θ in the vicinity of 76° is defined as I(220) in an X-ray diffraction pattern measured on the tabular surface, the nickel-iron-zinc alloy nanoparticles satisfy the following relation I(220)/[I(220)+I(200)]>0.5.

* * * * *